United States Patent [19]

Kitade et al.

[11] Patent Number: 5,694,074
[45] Date of Patent: Dec. 2, 1997

[54] SEMICONDUCTOR INTEGRATED CIRCUIT BEING ABLE TO GENERATE SUFFICIENT BOOST POTENTIAL DISREGARDING GENERATION OF NOISE

[75] Inventors: Osamu Kitade; Yutaka Ikeda, both of Hyogo, Japan

[73] Assignee: Mitsubishi Denki Kabushiki Kaisha, Tokyo, Japan

[21] Appl. No.: 580,774

[22] Filed: Dec. 29, 1995

Related U.S. Application Data

[63] Continuation-in-part of Ser. No. 463,803, Jun. 5, 1995, abandoned.

[30] Foreign Application Priority Data

Oct. 31, 1994 [JP] Japan ................. 6-267292

[51] Int. Cl.[6] ................. H03K 17/30
[52] U.S. Cl. ................. 327/390; 327/589
[58] Field of Search ................. 327/534, 535, 327/536, 537, 538, 540, 541, 543, 390, 589, 434

[56] References Cited

U.S. PATENT DOCUMENTS

| | | | |
|---|---|---|---|
| 4,769,784 | 9/1988 | Doluca et al. | 327/537 |
| 4,980,576 | 12/1990 | Rossi et al. | 327/530 |
| 5,029,282 | 7/1991 | Ito | 327/536 |
| 5,159,543 | 10/1992 | Yamawaki | 307/110 |
| 5,258,662 | 11/1993 | Skovmand | 327/544 |
| 5,365,121 | 11/1994 | Morton et al. | 327/170 |

FOREIGN PATENT DOCUMENTS

| | | | |
|---|---|---|---|
| 58-39117 A | 3/1983 | Japan . | |
| 63-179614 | 7/1988 | Japan | 327/390 |
| 63-179615 | 7/1988 | Japan | 327/390 |
| 1-32715 A | 2/1989 | Japan . | |
| 2-177716 A | 7/1990 | Japan . | |

*Primary Examiner*—Terry Cunningham
*Attorney, Agent, or Firm*—Lowe, Price, LeBlanc & Becker

[57] ABSTRACT

A semiconductor integrated circuit comprises a NAND gate which constitutes a previous stage circuit, a reset circuit, a charging circuit, and a capacitor for generating a boost potential. A signal of a node A expressing data and a signal of a node B expressing permission of outputting data are not only input to the NAND gate, but also to the reset circuit, and the output of the reset circuit is not only input to the charging circuit but also to the NAND gate; therefore, the previous stage circuit and the reset circuit are interlinked with the output signals. In the result, even in a case where noise is generated in the node A, it is possible to obtain a sufficient boost potential generated in the capacitor.

4 Claims, 9 Drawing Sheets

FIG. 11

SEMICONDUCTOR INTEGRATED CIRCUIT BEING ABLE TO GENERATE SUFFICIENT BOOST POTENTIAL DISREGARDING GENERATION OF NOISE

This application is a continuation in part of application Ser. No. 08/463,803 filed Jun. 5, 1995, now abandoned.

BACKGROUND OF THE INVENTION

1. Field of the Invention

The present invention relates to a semiconductor integrated circuit and in particular it relates to a semiconductor integrated circuit which is able to generate sufficient boost potential even when noise is generated.

2. Description of the Related Art

Figure 7:
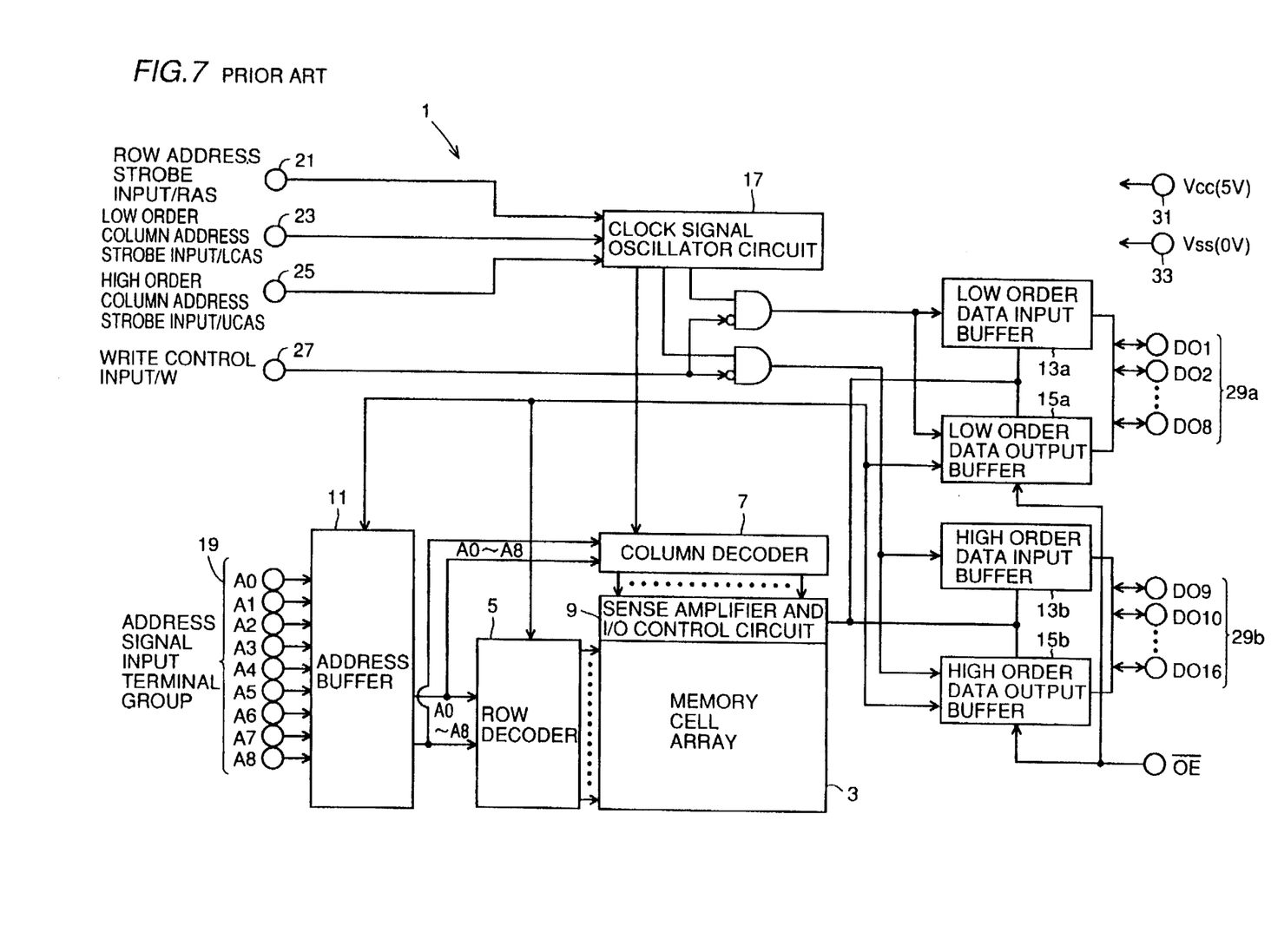
FIG. 7 is a block diagram of an ordinary DRAM

FIG. 7 is a block diagram showing an ordinary DRAM.

A DRAM 1 will be explained referring to FIG. 7 in the following.

The DRAM 1 comprises a memory cell array 3, a row decoder 5, column decoder 7, sense amplifier and I/O control circuit 9, address buffer 11, a low order data input buffer 13a, a high order data input buffer 13b, a low order data output buffer 15a, a high order data output buffer 15b, and a clock signal oscillator circuit 17. The DRAM 1 also comprises a control signal input terminals 21, 23, 25 and 27, an address signal input terminal group 19, an output enable signal input terminal 35, data input/output terminal groups 29a and 29b, a terminal 31 for external power supply potential Vcc (5V), and a terminal 33 for grounding potential Vss (0V).

The memory cell array 3 comprises a plurality of memory cells disposed in rows and columns, word lines provided corresponding to respective rows of memory cells, and bit lines provided corresponding to respective columns of memory cells. The address buffer 11 gives address signals, A0 to A8, given from the exterior through the address signal input terminal group 19, selectively to the row decoder 5 and to the column decoder 7.

The row decoder 5 selects a word line out of a plurality of word lines in response to the row address signals, A0 to A8, given by the address buffer 11, and activates a memory cell connected to the word line. The column decoder 7 selects a bit line out of a plurality of bit lines in response to the column address signals, A0 to A8, given by the address buffer 11.

In a write operation period, the low order data input buffer 13a and the high order data input buffer 13b give data input from data input/output terminal groups, 29a and 29b, respectively to a selected pair of bit lines through the sense amplifier and I/O control circuit 9. In a read operation period, the sense amplifier and I/O control circuit 9 amplifies a minute potential of the selected pair of bit lines and gives the amplified potential to the low order data output buffer 15a and the high order data output buffer 15b.

The low order data output buffer 15a outputs the read out data from the sense amplifier and I/O control circuit 9 to the data input/output terminal group 29a in response to the output enable signal/OE input from the output enable signal input terminal 35. In a similar way to the above, the high order data output buffer 15b outputs the read out data from the sense amplifier and I/O control circuit 9 to the data input/output terminal group 29b in response to the output enable signal/OE input from the output enable signal input terminal 35.

The clock signal oscillator circuit 17 selects a predetermined operation mode based on a row address strobe signal/RAS, a low order column address strobe signal/LCAS and a high order column address strobe signal/UCAS which are given from the exterior through the control signal input terminals, 21, 23, 25, and 27, and controls and drives the whole DRAM 1.

Figure 8:
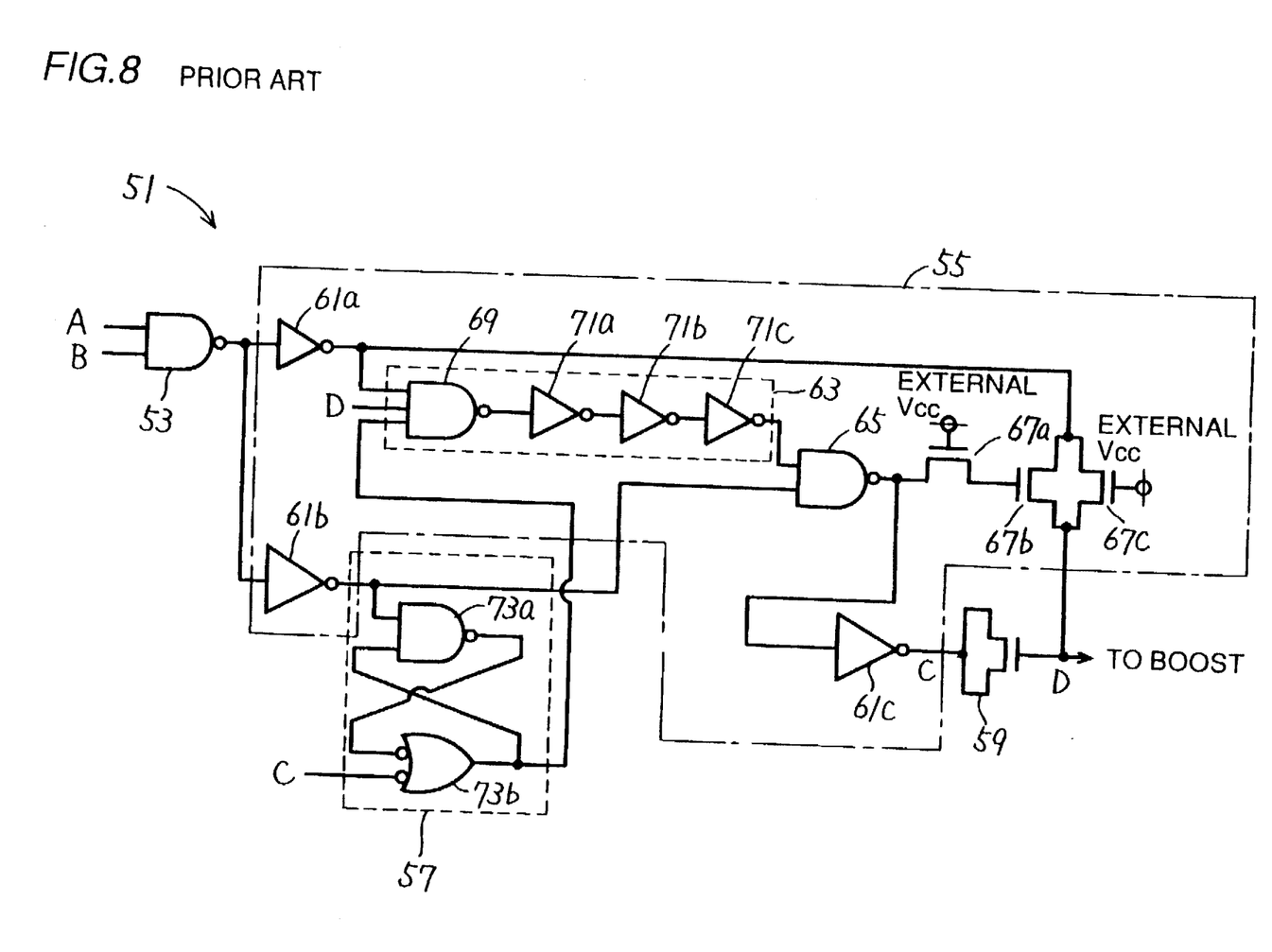
FIG. 8 is a circuit diagram showing a conventional semiconductor integrated circuit to be used for a low order data output buffer and a high order data output buffer shown in FIG. 7.

FIG. 8 is a circuit diagram showing a conventional semiconductor integrated circuit which is used in a low order data output buffer and in a high order data output buffer shown in FIG. 7.

A semiconductor integrated circuit 51 comprises a NAND gate 53 constituting a previous stage circuit, a charging circuit 55, a reset circuit 57, and a capacitor 59 as shown in FIG. 8. The semiconductor integrated circuit 51 is a circuit for generating a boost potential at one end part of the capacitor 59.

NAND gate 53 is input with a signal of a node A showing data RD and a signal of a node B showing OEN permitting the output of the data RD.

The capacitor 59 is a capacitor of a MOS capacity type and the source and the drain are connected to each other.

The charging circuit 55 comprises inverters 61a, 61b and 61c, a delay circuit 63, NAND gate 65, and N channel MOS transistors (hereinafter referred to as NMOS), 67a, 67b and 67c. The delay circuit 63 comprises NAND gate 69 and inverters, 71a, 71b and 71c.

The output of the NAND gate 53 is input to the inverters, 61a and 61b of the charging circuit 55. The output of the inverter 61a is given to one of the source/drain of each of the NMOS, 67b and 67c, and the output of the inverter 61b is given to the NAND gate 65 and to the NAND gate 73a of the reset circuit 57. The other of the source/drain of each of the NMOS, 67b and 67c, of the charging circuit 55 and one end of the capacitor 59 are connected to each other through a node D. The output of the inverter 61c of the charging circuit 55 is given to the other end of the capacitor 59 through a node C. A potential level signal of the node D is input to the 3 input NAND gate 69 of the delay circuit 63. A potential level signal of the node C is input to the NAND gate 73b of the reset circuit 57. The output of the NAND gate 73a is input to the NAND gate 73b, and the output of the NAND gate 73b is input to the NAND gate 73a and to a 3 input NAND gate 69 respectively.

The output of the inverter 61a is input to the 3 input NAND gate 69, and the output of the 3 input NAND gate 69 is input to a NAND gate 65 through inverters, 71a, 71b and 71c. To the NAND gate 65, as described in the above, the output of the inverter 61 is also input, and the output is input to the inverter 61c. The output of the NAND gate 65 is given to the gate electrode of the NMOS 67b through from one of the source/drain to the other of source/drain of the NMOS 67a to whose gate electrode an external power supply potential Vcc (5.0 V) is given. The external power supply potential Vcc (5.0V) is also given to the gate electrode of the NMOS 67c.

Figure 9:
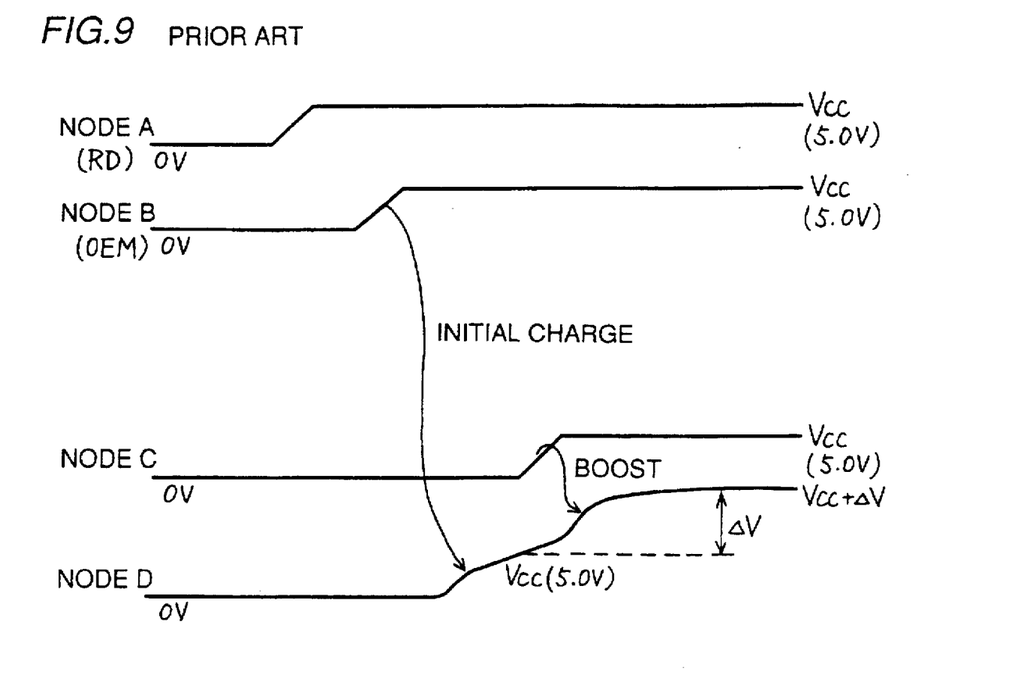
FIG. 9 is an explanatory representation for explaining the circuit shown in FIG. 8, and it shows the time charts of the node A, the node B, the node C and the node D when there is no noise in the node A.

FIG. 9 are time charts for the node A, the node B, the node C and the node D to be used for explaining the operation of the semiconductor integrated circuit shown in FIG. 8.

In an initial state, the potentials of the node A, the node B, the node C and the node D are all in an L level as shown in FIG. 8 and FIG. 9. The L level is the grounding potential (0 V). At first, the potential of the node A becomes an H level, that is, the data RD are input. The H level is equal to the external power supply potential Vcc. Thereby, the output of the NAND gate 53 is made to be in a standby state. Next, the potential of the node B is changed from the L level to the H level. In other words, an OEN signal, permitting the output of data, is given to the NAND gate 53. Then, the NAND gate 53 outputs a signal in the L level. The inverter 61a which receives the L level signal outputs an H level signal. The signal in the H level, the external power supply potential Vcc, is given to the node D, and an electric charge is accumulated in the capacitor 59; thus the initial charge of the capacitor 59 is executed.

On the other hand, the signal in the L level output from the NAND gate 53 is input to the NAND gate 65 through the inverter 61b, and the NAND gate 65 is made to be in a standby state. Since the potential of the output of the inverter 61a is in the H level, the potential of the node D is in the H level, and the potential of the node C is in the L level, the potential of the output of the NAND gate 73b is made to be in the H level and the potential of the output of the 3 input NAND gate 69 is made to be in the L level. Thereby, a signal in the H level is given to the NAND gate 65 through the inverters, 71a, 71b and 71c. Thus, the NAND gate 65 outputs a signal in the L level.

Then, the NMOS 67b is made OFF and the output of the inverter 61c is made to be in the H level. Therefore, the node C is made to be in the H level and the electric charge is further accumulated in the capacitor 59, and the potential of the node D is boosted to a potential of Vcc+δV.

As described in the above, the semiconductor integrated circuit 51 is finally able to generate a boost potential at the node D.

In order to generate such a boost potential, it is necessary to make the potential of the node C and the node D be in the L level in an initial state, and further it is necessary to make the potential of the node C be in the H level after the potential of the node D is made to be in the H level. Therefore, the reset circuit 57 makes the potential of the node C be in the L level in the initial state.

Explanation will be given concerning the above. It is assumed that the potential of the node C is, for example, in the H level. A signal in the H level output from the node C is input to one side of the NAND gate 73b. Since the output of the inverter 61b is in the L level in the initial state, the output of the NAND gate 73a is in the H level. In the result, the NAND gate 73b is able to output a signal in the L level. Therefore, the NAND gate 65 is able to output a signal in the H level through the delay circuit 63 to which the L level output is input and the inverter 61c outputs a signal in the L level and the potential of the node C is made to be in the L level. Therefore, the potential of the node C is kept in the L level before the boosting operation to make the potential of the node D be in a boost potential is performed.

Figure 10:
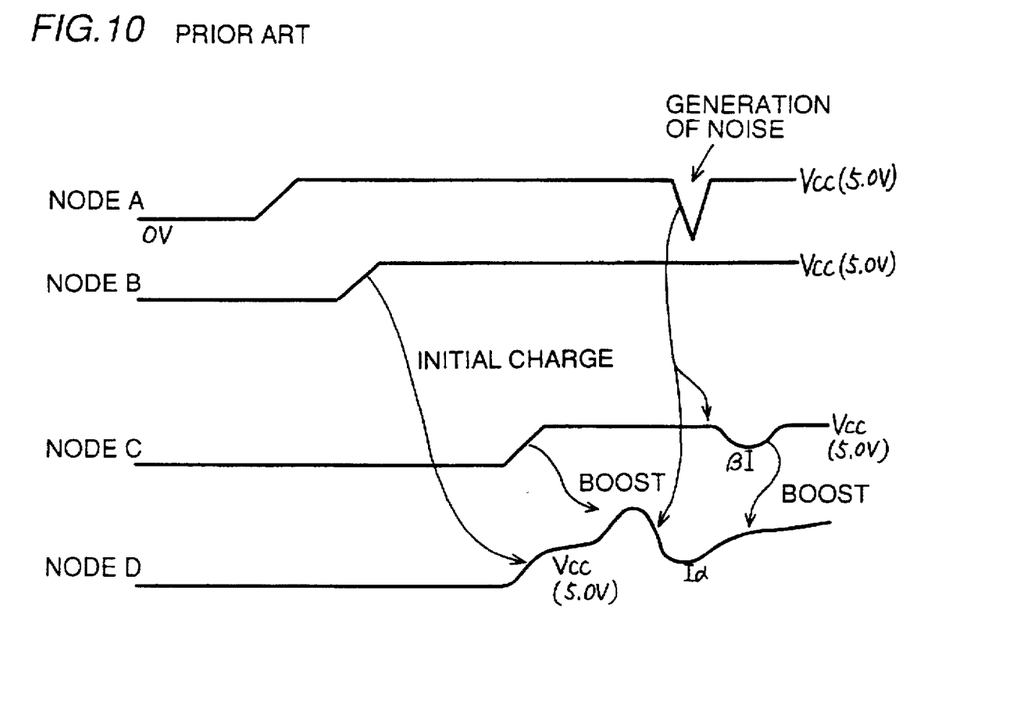
FIG. 10 is an explanatory representation for explaining the operation of the circuit shown in FIG. 8, and it shows the time charts of the node A, the node B, the node C and the node D when noise occurs in the node A.

FIG. 10 is an explanatory representation for explaining a problem which occurs in the semiconductor integrated circuit shown in FIG. 8, and it shows time charts of the node A, the node B, the node C and the node D in a case where noise is generated in the node A.

The operation till the initial charge of the capacitor 59 is performed to make the potential of the node D be in the H level is similar to the above-mentioned operation as shown in FIG. 10, so that the explanation the operation will be omitted. Explanation will be commenced at a process in which the potential of the node B is changed from the L level to the H level. The capacitor 59 is charged to make the potential of the node C be in the H level and to make the potential of the node D be in a boost potential.

In this case, it is assumed that a noise is generated in the node A which lowers the potential of the node A from the H level to the L level and after a while the potential is recovered to the H level. Thereby, the output of the NAND gate 53 is temporarily changed from the L level to the H level. The inverter 61a receives a signal in the H level and outputs a signal in the L level and it is input to the node D through the NMOS 67c and it suddenly lowers the potential of the node D in a boosting period. With the process mentioned the above, the potential of the node D is lowered to a certain potential α which is decided depending on the relation between the potential of the noise generated in the node A and the potential of the node D in the boosting period. In correspondence to the recovery of the potential of the node A to the H level after the generation of noise, the potential of the node D is recovered up to the external power supply potential Vcc (5.0 V) which is the potential when the capacitor 59 is initially charged.

On the other hand, because of the generation of noise, the inverter 61b outputs a signal in the L level and the NAND gate 73a of the reset circuit 57 temporarily outputs a signal in the H level. The output of the NAND gate 65 to which the output of the inverter 61b is input is also made to be in the H level and the output of the inverter 61c is made to be in the L level, and the potential of the node C is lowered from the H level. In some case, the potential of the node C is not made to be in a complete L level depending on the kind of noise or the potential of the node D. Therefore, a halfway potential β which lies between the external power supply potential Vcc, the H level potential, and the grounding potential, the L level potential, is generated, and the halfway potential β is input to the NAND gate 73b of the reset circuit 57. In the result, the reset circuit 73b judges that a H level signal is temporarily input, and it outputs a signal in the L level.

However, the delay circuit 63 generates a delay time of a certain degree, so that when the L level signal is input to the delay circuit 63, the potential of the output of the delay circuit is in the H level. The output of the inverter 61b is also in the H level because of the ending of the occurrence of noise. Therefore, the NAND gate 65 outputs a signal in the L level. In the result, the potential of the node C is changed from the halfway potential β to the external power supply potential Vcc, and boosting operation is performed to raise the potential of the node D to a boost potential. In this case, the boost potential of the node D is not a sufficient boost potential because the rise of the potential of the node C is not from the L level, 0V, to the H level, the external power supply potential Vcc, but it is from the halfway potential to the potential in the H level.

For example, when the node D is initially charged to 5 V and the potential of the node C is changed from the L level to the H level, that is, from 0 V to 5 V, the potential of the node D is boosted up to, 5 V+5 V=10 V; however, in the case where the node D is initially charged up to 5 V and the potential of the node C is changed from 3 V to 5 V disturbed by noise, the potential of the node D is boosted only to, 5 V+2 V=7 V.

Because of the fact that the potential of the node D is lowered by the noise generated in the node A and the boosting operation is performed without finishing the initial charge of the capacitor, it is understood that a sufficient boost potential is not generated.

As described in the above, in a conventional circuit, there has been a problem that a sufficient boost potential is not generated in the node D disturbed by the noise generated in the node A.

SUMMARY OF THE INVENTION

An object of the present invention is to offer a semiconductor integrated circuit which is able to generate a sufficient boost potential even in a case where noise is generated in an input signal which is necessary to generate a boost potential.

In a phase of the present invention, a semiconductor integrated circuit is offered which comprises a capacitor 59, a first charging portion, 153, 61a and 67c, a second charging portion, 153, 63, 61b, 65, 67a, 67b and 61c, and a compulsion portion 155. The potential of both end parts of the capacitor 59 is set to a first potential level L in an initial state and it is a capacitor for generating a boost potential. The first charging portion, 153, 61a and 67c, charges the capacitor 59 to make the potential of one end part of the capacitor 59 be in a second potential level H which is higher than the first potential level L. After the potential of one end part of the capacitor 59 is made to the second potential level H, the second charging portion, 153, 63, 61b, 65, 67a, 67b and 61c, charges the capacitor 59 to make the potential of the other end part of the capacitor 59 be in the second potential level H in order to generate a boost potential at one end part the capacitor 59. The compulsion portion 155 lowers the potential of the other end part of the capacitor 59 from the second potential level H to the first potential level L corresponding to the lowering of the potential of one end part of the capacitor 59 from the second potential level H to a predetermined potential level, and after that, the compulsion portion 155 compels the second charging portion, 153, 63, 61b, 65, 67a, 67b and 61c, to resume charging operation corresponding to the recovery of the potential of one end part of the capacitor 59 to the second potential level H.

According to the phase of the present invention as described in the above, since the second charging portion is compelled to resume charging operation for the capacitor 59, a sufficient boost potential is generated at one end part of the capacitor 59.

In another phase of the present invention, an output portion, 203, 207 and 255, which outputs a signal is further provided. The output portion, 203, 207 and 255, comprises the node portions, 207 and 255, and the transmission portion 203. The node portions, 207 and 255, have a potential being equal to a power supply potential level. The transmission portion 203 transmits a signal of the node portions, 207 and 255, having a potential of the power supply potential level to the exterior corresponding to the boost potential at one end part of the capacitor 59 after it is charged by the second charging portion, 153, 63, 61b, 65, 67a, 67b and 61c.

Therefore, according to the phase of the present invention, the signal having the potential of the power supply potential level is transmitted to the exterior corresponding to the sufficient boost potential of one end part of the capacitor 59, so that the output of a certain signal can be secured without causing any malfunction.

In a further phase of the present invention, a semiconductor integrated circuit is offered which comprises a capacitor 59, a previous stage circuit 153, a charging portion 55 and a compulsion portion 155. In the initial state, the potential at both end parts of the capacitor 59 is set to the first potential level L, and it is the capacitor for generating a boost potential. A first signal A and a second signal B are input to the previous stage circuit 153. The charging portion 55 charges the capacitor 59 in order to make the potential of one end part of the capacitor 59 be in the second potential level H corresponding to the change in the potential of the first signal A and the second signal B to be input to the previous stage circuit 153 from the first potential level L to the second potential level H in order, and after that, it charges the capacitor 59 in order to make the potential of the other end part of the capacitor 59 be in the second potential level H to make a boost potential be generated at one end part of the capacitor 59. The first signal A and the second signal B are input to the compulsion portion 155, and after the capacitor 59 is charged to make the potential of the other end part of the capacitor 59 be in the second potential level H, the compulsion portion 155 discharges the electric charge stored in the capacitor 59 corresponding to the lowering in the potential level of the first signal A or the second signal B, and compels the charging portion 55 to resume the charging operation.

Therefore, according to the phase of the present invention, a sufficient boost potential can be generated at one end part of the capacitor 59 because of the reason that when the lowering of the potential occurs in the first signal or the second signal, the electric charge in the capacitor 59 is discharged by the compulsion portion 155 and the charging portion 55 is compelled to resume the charging operation by the compulsion portion 155.

Therefore, according to the phase of the present invention, the charge stored in the capacitor is discharged and charging operation is resumed corresponding to the lowering in the potential of the first signal or the second signal, so that a sufficient boost potential is generated at one end part of the capacitor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The different points in an embodiment from a conventional example will be explained in particular referring to FIG. 1.

In the case of a semiconductor integrated circuit 151, a 3 input NAND gate 153 is provided for constituting a previous stage circuit in place of the NAND gate 53, and a reset circuit 155 is provided in place of the reset circuit 57.

The reset circuit 155 comprises a 3 input NAND gate 157 and a NAND gate 159.

A signal of the node A showing data RD, a signal of the node B showing OEN which expresses the permission of the output of the data RD, and the output of the reset circuit 155 are input to the 3 input NAND gate 153. The output of the 3 input NAND gate 153 is input to inverters, 61a and 61b, respectively.

Figure 11:
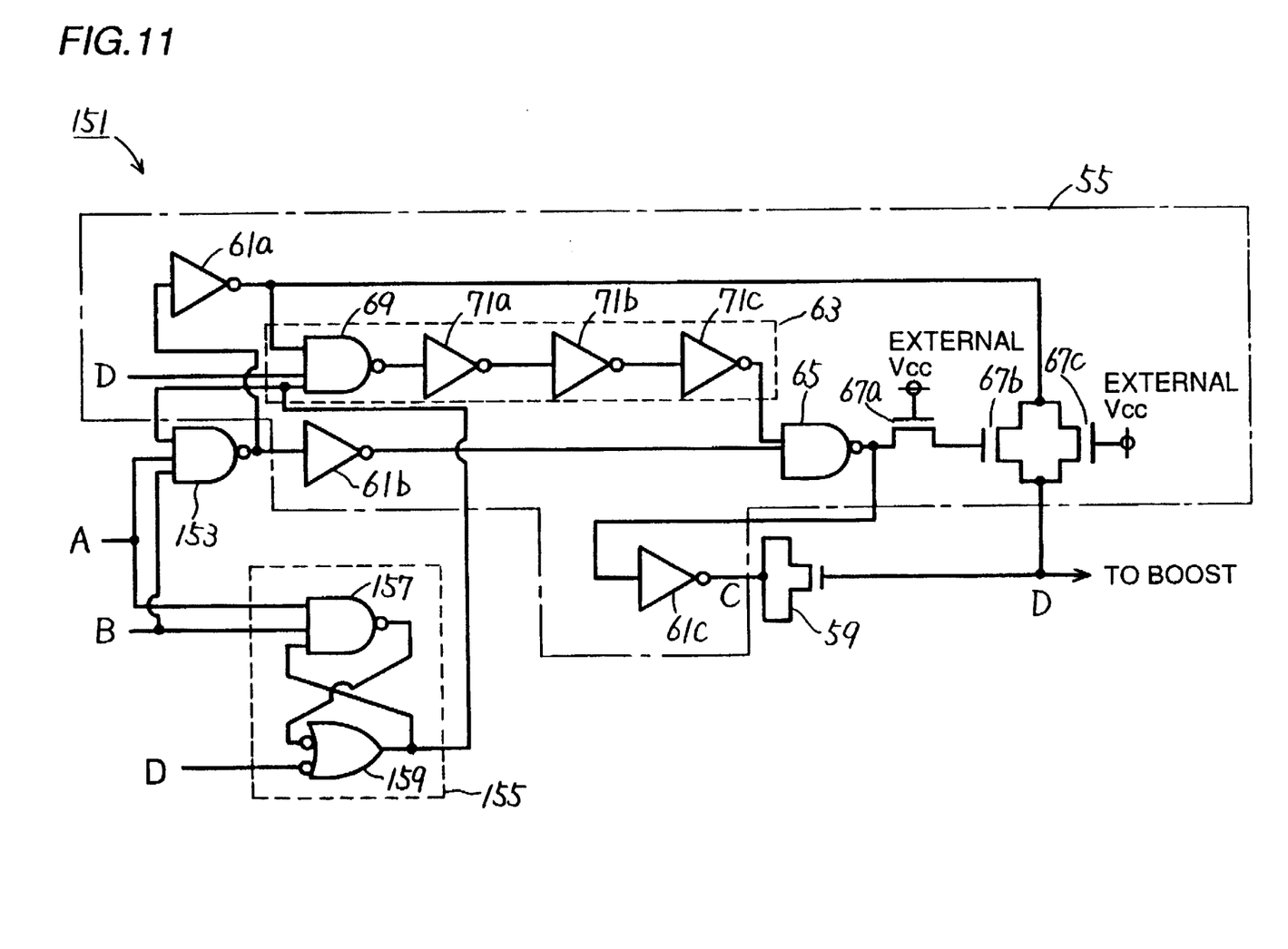
FIG. 11 is a circuit diagram of a semiconductor integrated circuit in a still further embodiment according to the present invention.

The signal of the node A, the signal of the node B, and the output of the NAND gate 159 are input to the 3 input NAND gate 157 in the reset circuit 155. A signal of the node C and the output of the 3 input NAND gate 157 are input to the NAND gate 159. As shown in FIG. 11 a signal of the node D instead of a signal of the node C in FIG. 1, may be input to the NAND gate 159. The output of the NAND gate 159 is, as mentioned in the above, input to the NAND gate 153 which constitutes a previous stage circuit and also input to a delay circuit 63.

Figure 1:
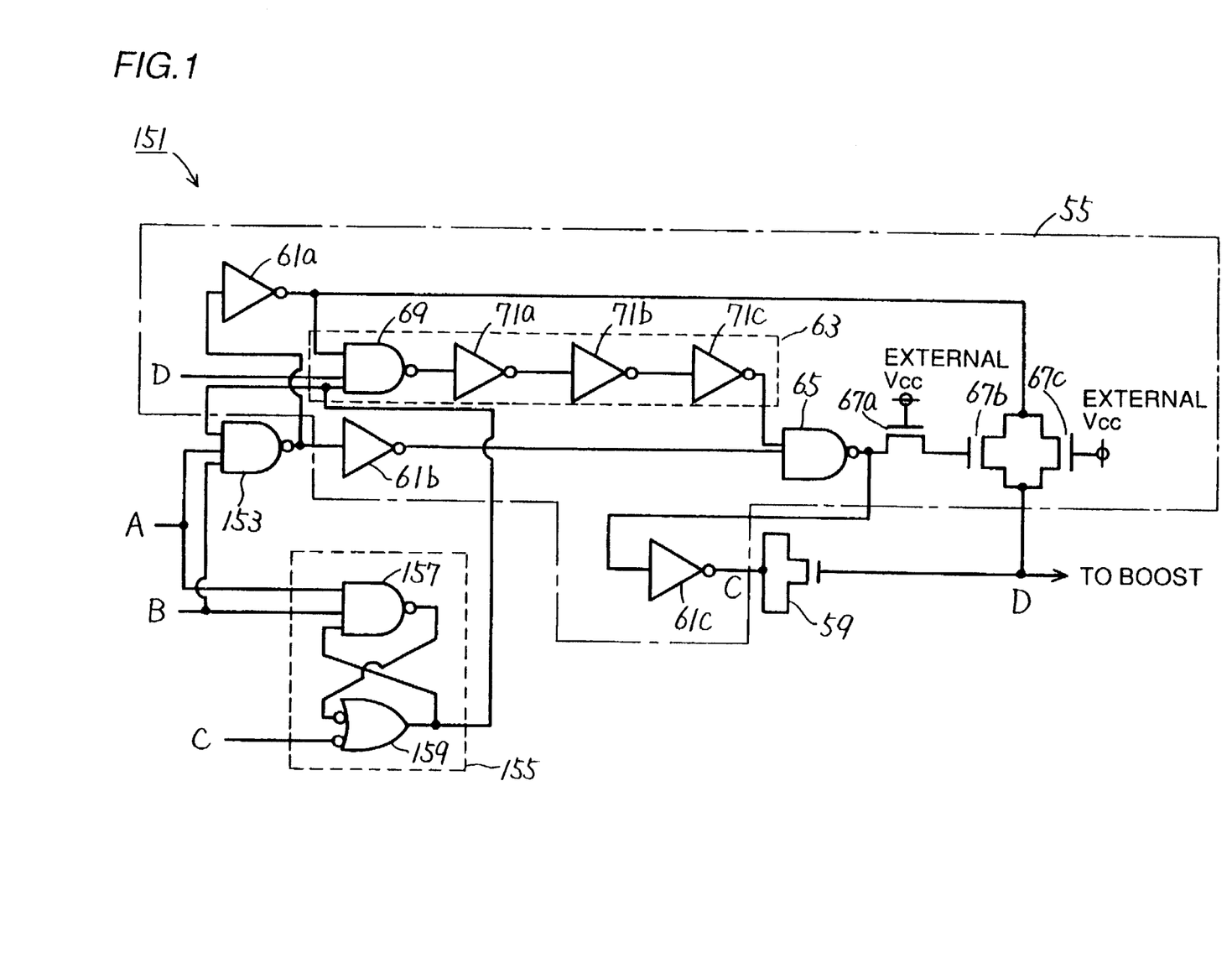
FIG. 1 is a circuit diagram of a semiconductor integrated circuit in an embodiment according to the present invention.
Figure 2:
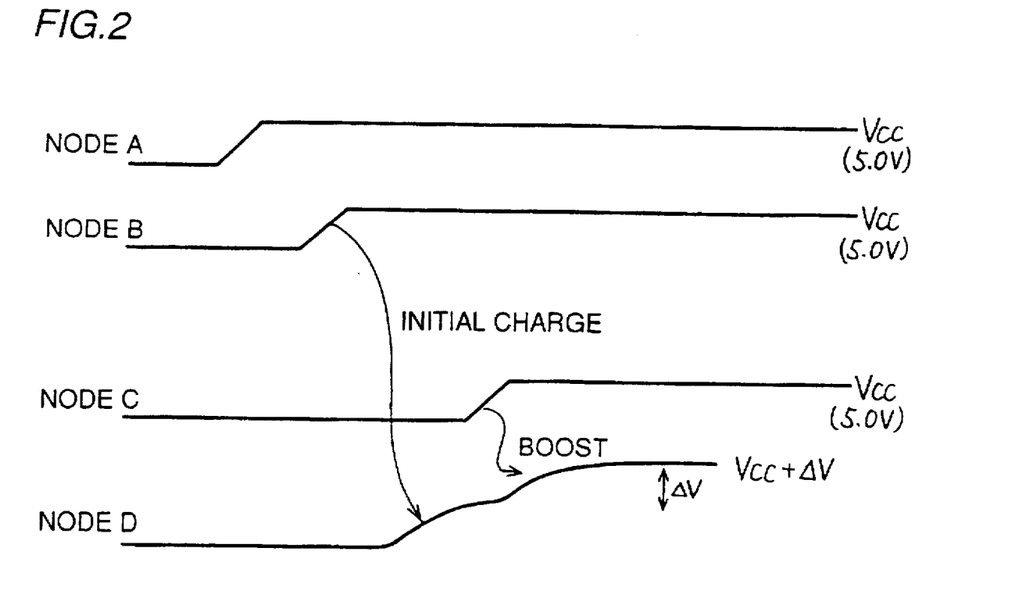
FIG. 2 is an explanatory representation for explaining the operation of the circuit shown in FIG. 1, and it shows the time charts of the node A, the node B, the node C and the node D when there is no noise in the node A
Figure 3:
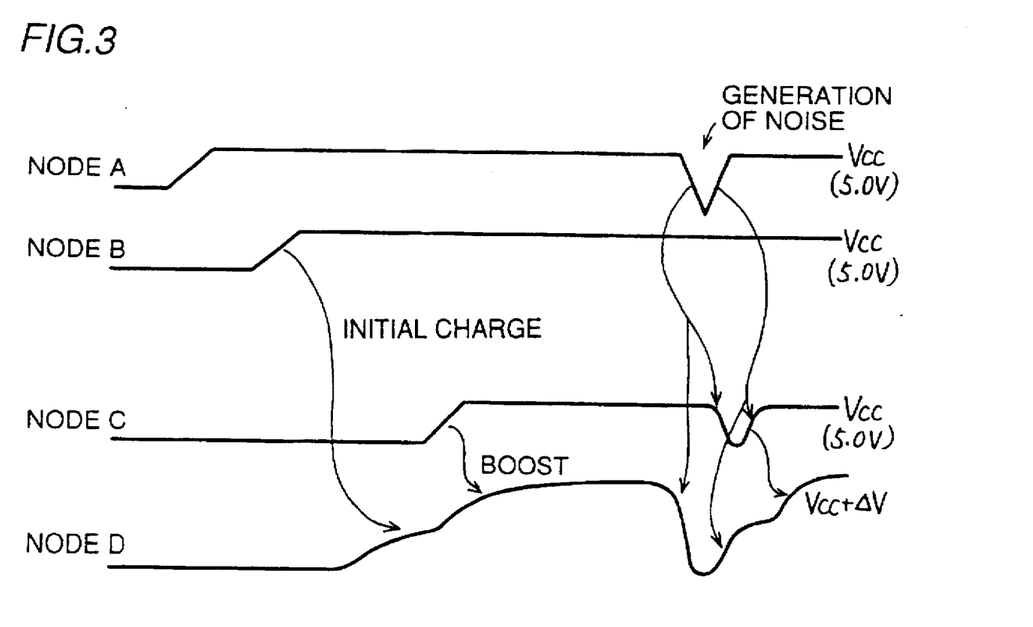
FIG. 3 is an explanatory representation for explaining the operation of the circuit shown in FIG. 1, and it shows the time charts of the node A, the node B, the node C and the node D when noise occurs in the node A.

FIG. 2 is an explanatory representation for explaining the operation of the circuit shown in FIG. 1, and it shows time charts of the node A, the node B, the node C and the node D when there is no noise in the node A; FIG. 3 is an explanatory representation for explaining the operation of the circuit shown in FIG. 1, and it show time charts of the node A, the node B, the node C and the node D when noise occurs in the node A.

At first, the operation for generating an ordinary boost potential will be explained referring to FIG. 2, and after that, the fact that a sufficient boost potential can be generated even in a case where noise occurs in the node A will be explained referring to FIG. 3.

In an initial state (in a standby period), the node A, the node B, the node C and the node D are all set to be in an L level. Therefore, the 3 input NAND gate 157 of the reset circuit 155 outputs a signal in an H level, the NAND gate 159 also outputs a signal in the H level, and a NAND gate 69 in the delay circuit 63 is in a standby state. The NAND gate 153 to which the output of the reset circuit 155 is input is also in a standby state.

Next, in order to perform the initial charge of a capacitor 59, at first, the potential of the node A is changed from the L level to the H level. After that, when the potential of the node B is changed from the L level to the H level, the inputs of the 3 input NAND gate 153 are all changed to the H level and a signal in the L level is output. The L level signal makes the node D be in the H level through the inverter 61a and further through the NMOS 67c; thus the initial charge of the capacitor 59 is executed.

With the change of the potential of the node D to the H level, the potentials of all inputs to the 3 input NAND gate of the delay circuit 63 are changed to H level. Thereby, the potential of the output of the 3 input NAND gate 69 is made to be in the L level. The L level signal is changed to a signal in the H level in passing through inverters, 71a, 71b and 71c, and it is input to a NAND gate 65. Thereby the potentials of all inputs to the NAND gate 65 are made to be in the H level and the NAND gate 65 outputs a signal in the L level. Therefore, an NMOS 67b is made OFF and the inverter 61c outputs a signal in the H level. In the result, the potential of the node D falls into a state where it is unable to discharge its potential to any portion, and with the rise of the potential of the node C to the H level, the potential of the node D is boosted to a boost potential, $Vcc + â_7V$.

Next, a process in which the potential of the node D is charged up to the H level and the potential of the node C is changed from the L level to the H level will be explained referring to FIG. 3, but a process in which the capacitor 59 is charged initially is the same as the process described in the above, so that the explanation concerning the process will be omitted.

The potential of the node D is boosted to a boost potential, $Vcc + â_7V$ with the change of the potential of the node C from the L level to the H level. However, because of the occurrence of noise in the node A, the 3 input NAND gate 153 outputs a signal in the H level. Thereby, the inverter 61a outputs a signal in the L level and lowers the potential of the node D from the boost potential. The lowering of potential reaches a complete L level, 0 V.

The above-mentioned process will be explained in the following. Because of the occurrence of noise in the node A, the 3 input NAND gate 157 of the reset circuit 155 outputs a signal in the H level. Therefore, a signal in the H level is input to one input of the NAND gate 159. The output of the inverter 61b is made to be in the L level by the occurrence of noise, and the signal reaches the node C through the NAND gate 65 and the inverter 61c, which makes the potential of the node C lower to the halfway potential as explained in a conventional example. The NAND gate 159 of the reset circuit 155 judges that a signal in the H level are input because of the halfway potential, and outputs a signal in the L level.

Since the signal in the L level is input to the 3 input NAND gate 153, the 3 input NAND gate 153 outputs a signal in the complete H level. Therefore, the signal in the H level lowers the potential of the node C and the node D to a complete 0 V. In other words, the potential of the node D is lowered to 0 V by a signal in the L level which is input through the inverter 61a, and the potential of the node C is lowered to a 0 V by a signal in the L level which is input through the inverter 61b, the NAND gate 65 and the inverter 61c.

In a state where the potential of the node C is in the L level, and in a step where the potential of both node portions, A and B, are made to be in the H level, the reset circuit 155 is able to output a signal in the H level, so that so far the NAND gate 153 is unable to perform boost operation. After the potential of both node portions, C and D, is lowered to a grounding potential, at first the potential of the node D is made to be in the H level by the boost operation for the second time and the initial charge of the capacitor 59 is performed, and after that, the node C is made to be in the H level by the signal output from the delay circuit 63, and the potential of the node D is boosted to a sufficient boost potential.

Figure 4:
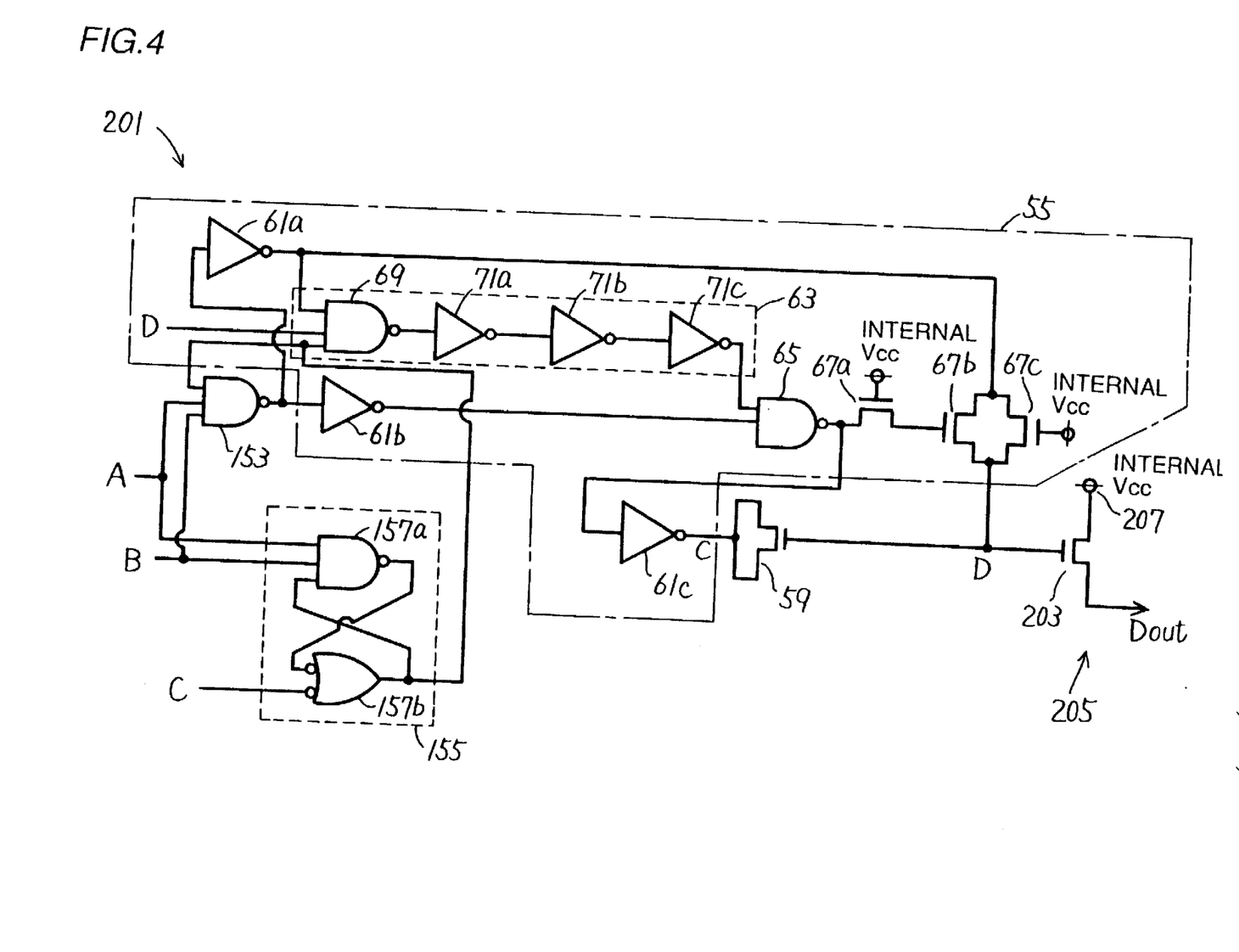
FIG. 4 is a circuit diagram of a semiconductor integrated circuit in another embodiment according to the present invention.
Figure 5:
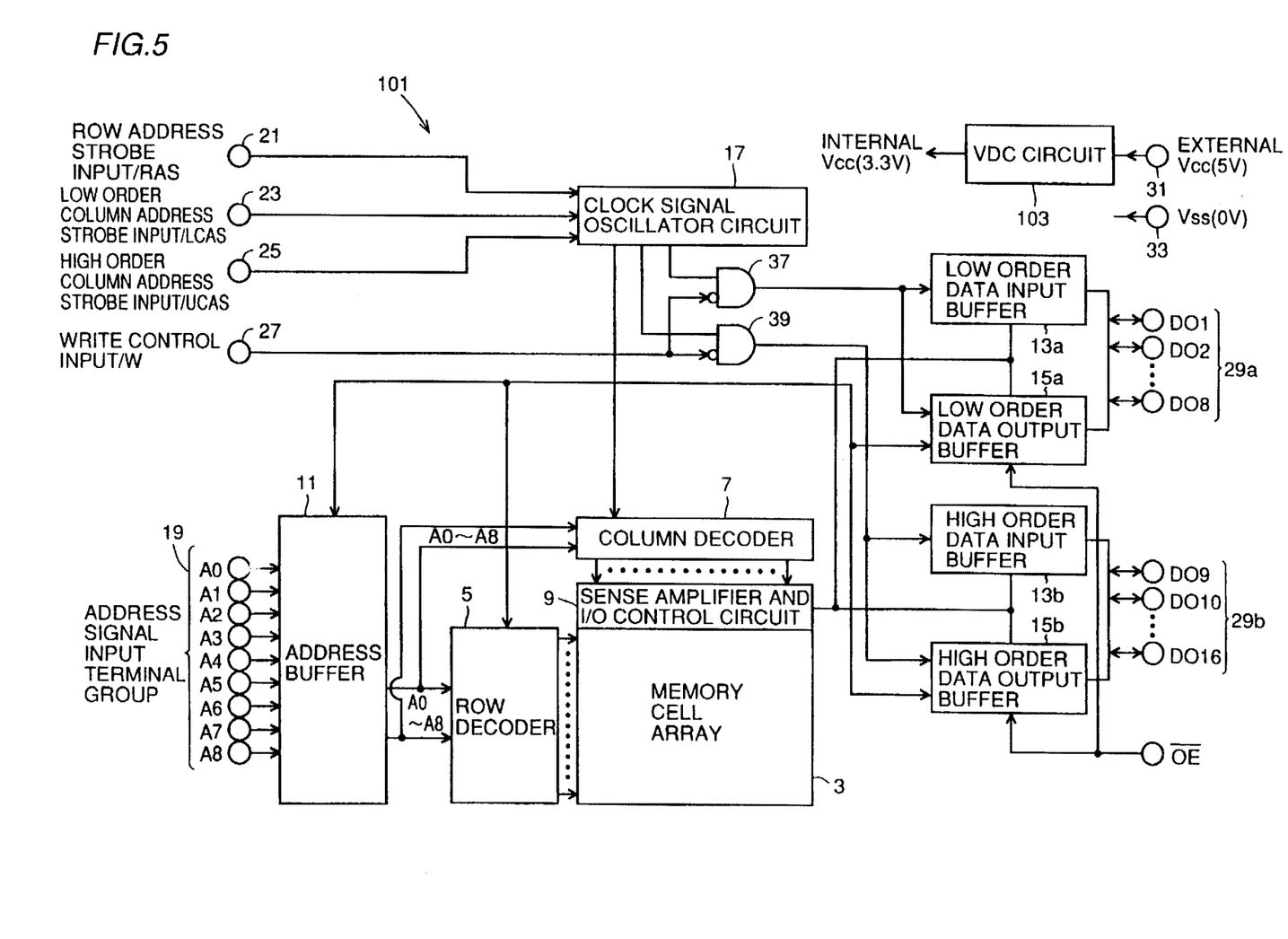
FIG. 5 is a block diagram of a DRAM in which a down converter circuit (VDC circuit) is shown, the circuit which generates an internal power supply potential Vcc (3.3 V) which is needed in the circuit shown in FIG. 4.

FIG. 4 is a circuit diagram of a semiconductor integrated circuit in another embodiment according to the present invention, and FIG. 5 is a block diagram showing a DRAM in which the semiconductor integrated circuit shown in FIG. 4 is to be used.

The different points from the embodiment shown in FIG. 1 will be explained referring to FIG. 4.

A semiconductor integrated circuit 201 is driven by a grounding potential (0 V) and an internal power supply voltage Vcc (3.3 V) which is generated from a voltage given to the gates of NMOS transistors, 67a and 67c. An output stage 205 is connected to the node D. The gate of the output stage 205 is connected to a node 207 having the potential of the internal power supply potential Vcc and to the node D, and the output stage 205 comprises an NMOS 203 whose source or drain is connected to the node 207.

Therefore, in order to generate an internal power supply potential Vcc which is needed in the present embodiment, a down converter circuit (VDC circuit) 103 which changes the external power supply potential Vcc (5 V) to the external power supply potential Vcc (3.3 V) is needed in a DRAM 101 as shown in FIG. 5.

It is made possible to generate a sufficient boost potential in the node D and the NMOS 203 can be securely made ON by using the internal power supply potential Vcc (3.3 V). Therefore, a signal having the internal power supply potential Vcc of the node 207 is output as an output signal Dout.

Figure 6:
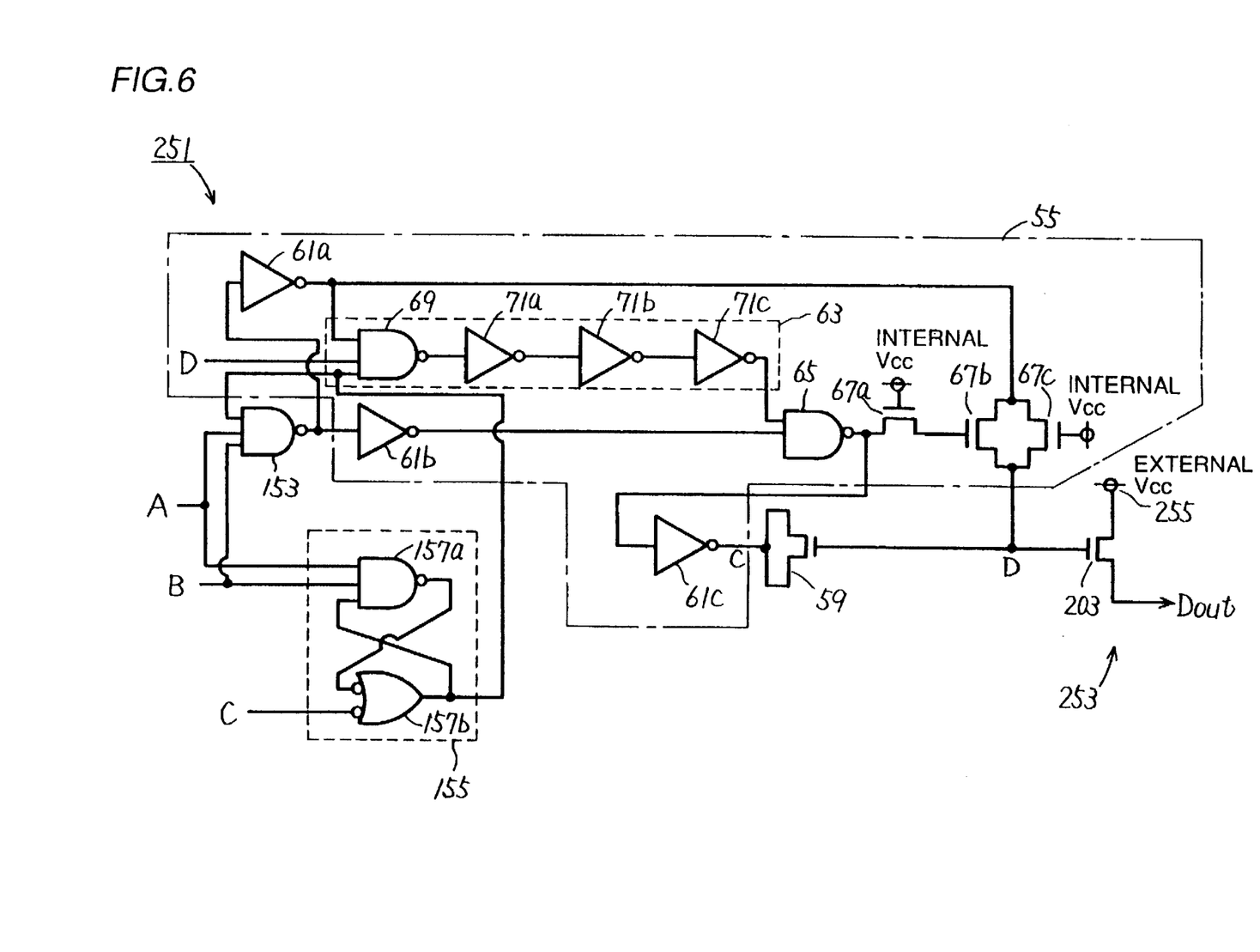
FIG. 6 is a circuit diagram of a semiconductor integrated circuit in a further embodiment according to the present invention.

FIG. 6 is a circuit diagram showing a semiconductor integrated circuit in a yet another embodiment according to the present invention.

In the case of a semiconductor integrated circuit 251, the potential of a node 255 which is connected to either of the source/drain of the NMOS 203 of the output stage 253 is made to the external power supply potential Vcc (5.0 V). Even if such an external power supply potential Vcc (5.0 V) is used, a sufficient boost potential is generated in the node D, so that NMOS 203 is securely made ON in the same way. Therefore, an output signal Dout having the potential of the external power supply potential Vcc (5.0 V) is output.

A capacitor of a MOS capacity type is shown in the embodiment shown in FIG. 1, the embodiment shown in FIG. 4, the embodiment shown in FIG. 6 and the embodiment shown in FIG. 11; however, a capacitor of a Poly-Poly capacity type is also good.

Explanation is given only about the case where noise is generated in the node A, but a case where noise is generated in the node B is the same as the above.

Noise can be other type of noise than that which once falls to the grounding potential from the internal (external) power supply potential Vcc and recovers to a normal state.

In the embodiment shown in FIG. 1, the embodiment shown in FIG. 4, the embodiment shown in FIG. 6, and the embodiment shown in FIG. 11 examples in which the invention is applied to an output buffer of a DRAM are shown; however, the invention can be applied to any circuit in which the generation of a sufficient boost potential is needed.

As described in the above, in the embodiments according to the present invention, a capacitor for generating a boost potential is charged to make the potential of one end part of the capacitor be in a second potential level being higher than a first potential level, and after that, the capacitor is charged to make the potential of the other end part of the capacitor be in the second potential level; after that, the potential of the other end part is changed from the second potential level to the first potential level corresponding to the lowering of the potential of one end part of the capacitor from the second potential level to a predetermined potential level; after that, the charging operation of the capacitor is resumed to make the potential of the other end part of the capacitor be in the second potential level corresponding to the recovery of the potential of one end part of the capacitor to the second potential level; thereby, it is made possible to generate a sufficient boost potential at one end part of the capacitor and to restrain malfunctions which are presumed to be caused by an insufficient boost potential.

It is to be understood by those skilled in the art that the foregoing description are preferred embodiments according to the present invention and that various changes and modifications may be made in the invention without departing from the spirit and the scope thereof.

What is claimed is:

1. A semiconductor integrated circuit for transmitting a predetermined potential in response to both a first signal and a second signal being at a first potential level comprising:

a first transistor for receiving and outputting the predetermined potential;

a capacitor having two electrodes, one electrode of said capacitor being connected to a control electrode of said first transistor;

first means for resetting said two electrodes of said capacitor at a second potential level lower than the first potential level and for charging said capacitor to make said one electrode of said capacitor be in the first potential level in response to the rise of the potentials of both the first signal and the second signal from the second potential level to the first potential level; and for charging said capacitor to make the other electrode of said capacitor be in the first potential level for generating a boost potential higher than the first potential level at said one electrode of said capacitor after said one electrode of said capacitor is charged to the first potential level; and means for detecting a noise lowering the potential of one of the first and second signals and then enforcing said first means to resume the resetting operation.

2. The semiconductor integrated circuit as defined in claim 1, wherein said capacitor comprises a second transistor having a control electrode forming said one electrode of said capacitor and first and second conductive electrodes connected to each other forming the other electrode of said capacitor.

3. The semiconductor integrated circuit as defined in claim 1, further comprising:

a voltage down converter circuit coupled to receiving an external power supply potential and converting the external power supply potential to an internal power supply potential lower than the external power supply potential to provide said first transistor with the internal power supply potential as the predetermined level.

4. A method of transmitting a predetermined potential in response to both a first signal and a second signal being at a first potential level, in a semiconductor integrated circuit, said method comprising the steps of:

resetting both electrodes of a capacitor at a second potential level lower than the first potential level;

charging said capacitor to make one electrode of said capacitor be in a first potential level;

charging said capacitor to make the other electrode of said capacitor be in the first potential level for generating a boost potential higher than the first potential level at said one electrode of said capacitor after said one electrode of said capacitor is charged to the first potential level;

resuming the resetting operation upon detecting a noise lowering the potential of one of the first and second signals; and transmitting a predetermined potential through a transistor in response to the boost potential at said one electrode of said capacitor.

* * * * *